(12) United States Patent
Hillis et al.

(10) Patent No.: US 7,714,267 B2
(45) Date of Patent: *May 11, 2010

(54) INTENSITY DETECTOR CIRCUITRY USING A CASCADE OF GAIN ELEMENTS

(75) Inventors: W. Daniel Hillis, Encino, CA (US); Nathan P. Myhrvold, Medina, WA (US); Lowell L. Wood, Jr., Bellevue, WA (US)

(73) Assignee: Searete, LLC, Bellevue, WA (US)

( * ) Notice: Subject to any disclaimer, the term of this patent is extended or adjusted under 35 U.S.C. 154(b) by 1 day.

This patent is subject to a terminal disclaimer.

(21) Appl. No.: 11/981,833

(22) Filed: Oct. 30, 2007

(65) Prior Publication Data

US 2008/0128591 A1    Jun. 5, 2008

Related U.S. Application Data

(63) Continuation-in-part of application No. 11/255,067, filed on Oct. 20, 2005, now Pat. No. 7,304,289, and a continuation-in-part of application No. 10/789,802, filed on Feb. 26, 2004, now Pat. No. 7,045,760, and a continuation-in-part of application No. 10/742,517, filed on Dec. 19, 2003, now Pat. No. 7,053,809.

(51) Int. Cl.
*H01J 40/14*    (2006.01)

(52) U.S. Cl. .............................. 250/214 R; 250/214 LA

(58) Field of Classification Search ............. 250/214 R, 250/214 A, 214.1, 214 LA, 214 AG; 330/310, 330/311, 152, 252
See application file for complete search history.

(56) References Cited

U.S. PATENT DOCUMENTS

| | | | |
|---|---|---|---|
| 4,996,417 | A | 2/1991 | Shinomiya |
| 5,011,295 | A | 4/1991 | Krishnan et al. |
| 5,337,340 | A * | 8/1994 | Hynecek ...................... 377/60 |
| 5,416,326 | A | 5/1995 | Andreotti |
| 6,509,575 | B1 | 1/2003 | Nanni |
| 7,053,809 | B2 | 5/2006 | Hillis et al. |
| 7,053,998 | B2 | 5/2006 | Hillis et al. |
| 7,123,844 | B2 | 10/2006 | Myrick |
| 7,250,595 | B2 | 7/2007 | Hillis et al. |
| 7,378,634 | B2 | 5/2008 | Tower et al. |

OTHER PUBLICATIONS

U.S. Appl. No. 12/455,581, Hillis, W. Daniel.

* cited by examiner

*Primary Examiner*—Que T Le

(57) ABSTRACT

A system is described that may determine an intensity measure. In certain example embodiments, a system may include circuitry for receiving and circuitry for assessing. The circuitry for receiving may receive an input signal at an input of a first gain element of a cascade of N gain elements. The circuitry for assessing may assess an intensity in response to one or more times associated with one or more output signals of the cascade of N gain elements satisfying one or more threshold values.

12 Claims, 5 Drawing Sheets

INTENSITY DETECTOR CIRCUITRY USING A CASCADE OF GAIN ELEMENTS

CROSS-REFERENCE TO RELATED APPLICATIONS

The present application is related to and claims the benefit of the earliest available effective filing date(s) from the following listed application(s) (the "Related Applications") (e.g., claims earliest available priority dates for other than provisional patent applications; claims benefits under 35 USC 119(e) for provisional patent applications), and incorporates in its entirety all matter of the following listed applications; the present application also claims the earliest available effective filing date(s) from, and also incorporates by reference in its entirety all subject matter to the extent not inconsistent herewith of any and all parent, grandparent, great-grandparent, etc. applications of the following listed application(s):

RELATED APPLICATIONS

1. For purposes of the USPTO extra-statutory requirements, the present application constitutes a continuation in part of currently co-pending U.S. patent application Ser. No. 10/742,517 entitled ANALOG-TO-DIGITAL CONVERTER CIRCUITRY, naming W. Daniel Hillis, Nathan P. Myhrvold, and Lowell L. Wood Jr. as inventors, filed 19 Dec. 2003 now U.S. Pat. No. 7,053,809, which is currently co-pending, or is an application of which a currently co-pending application is entitled to the benefit of the filing date.
2. For purposes of the USPTO extra-statutory requirements, the present application constitutes a continuation in part of currently co-pending United States patent application entitled INTENSITY DETECTOR CIRCUITRY, naming W. Daniel Hillis Nathan P. Myhrvold; and Lowell L. Wood Jr. as inventors, U.S. application Ser. No. 10/789,802 filed 26 Feb. 2004 now U.S. Pat. No. 7,045,760, which is currently co-pending, or is an application of which a currently co-pending application is entitled to the benefit of the filing date.
3. For purposes of the USPTO extra-statutory requirements, the present application constitutes a continuation in part of currently co-pending United States patent application entitled INTENSITY DETECTOR CIRCUITRY HAVING PLURAL GAIN ELEMENTS IN A CASCADE WITH PLURAL THRESHOLD VALUES, naming W. Daniel Hillis Nathan P. Myhrvold; and Lowell L. Wood Jr. as inventors, U.S. application Ser. No. 11/255,067 filed 20 Oct. 2005 now U.S. Pat. No. 7,304,289, which is currently co-pending, or is an application of which a currently co-pending application is entitled to the benefit of the filing date.

TECHNICAL FIELD

The present application relates, in general, to intensity detector circuitry.

SUMMARY

In one aspect, a system having an intensity detector includes but is not limited to: at least one cascade of N gain elements operably couplable with analog circuitry, the at least one cascade having at least (a) N greater than or equal to a positive integer sufficient to provide the at least one cascade with a gain such that a predetermined operable signal at an input of the at least one cascade generates a signal at an output of the at least one cascade that is larger than a predetermined operable threshold value, (b) an input of a first gain element of the at least one cascade operably couplable with the analog circuitry, (c) a gain element of the at least one cascade having a gain larger than one by an amount such that the noise factor of the at least one cascade operating on the predetermined operable signal at the input of the at least one cascade is substantially minimized, (d) one or more output value detection circuits respectively operably coupled with one or more outputs of the N gain elements, and (e) one or more timing recordation circuits operably coupled with said one or more output value detection circuits.

In one aspect, a method of constructing a system having an intensity detector with N gain elements includes but is not limited to: configuring a first gain element such that an input of the first gain element is operable to receive an input signal; connecting an output of a k'th gain element to an input of a k+1'th gain element, wherein k is an integer that is at least 1; connecting one or more outputs of the N gain elements respectively to one or more value detection circuits; configuring an N'th gain element such that an output of the N'th gain element is operable to generate an output signal; N being a positive integer such that a ratio between the output signal and the input signal is larger than a predetermined threshold gain when the input signal is received at the input of the first gain element; and connecting the one or more value detection circuits to a timing recordation circuit.

In one aspect, a method of determining an intensity measure includes but is not limited to: receiving an input signal at an input of a first gain element of a cascade of N gain elements; and assessing an intensity in response to one or more times associated with one or more output signals of the cascade of N gain elements satisfying one or more threshold values.

In one or more various aspects, related systems include but are not limited to circuitry and/or programming for effecting the method aspects described in the text and/or drawings of the present application; the circuitry and/or programming can be virtually any combination of hardware, software, and/or firmware configured to effect the foregoing-referenced method aspects depending upon the design choices of the system designer.

In one aspect, a system includes but is not limited to: a photo-detector array having at least one output; and at least one cascade of N gain elements operably coupled with the photo-detector array, having at least (a) N greater than or equal to a positive integer sufficient to provide the at least one cascade with a gain such that a predetermined signal at an input of the at least one cascade generates a signal at an output of the at least one cascade that is larger than a predetermined threshold value, (b) an input of a first gain element of the at least one cascade operably coupled with an output of the photo-detector array, (c) a gain element of the at least one cascade having a gain larger than one by an amount such that the noise factor of the at least one cascade operating on the predetermined signal at the input of the at least one cascade is substantially minimized, (d) one or more output value detection circuits respectively operably coupled with one or more outputs of the N gain elements; and (e) one or more timing recordation circuits operably coupled with said one or more output value detection circuits.

In one aspect, a method of intensity detection includes but is not limited to: detecting that a first gain element output signal of N gain elements in a cascade has satisfied a first predefined threshold; and determining an intensity value in response to a detection that a second gain element output signal of the N gain elements in the cascade has satisfied a second predefined threshold greater than the first predefined threshold.

In one aspect, a system having an intensity detector includes: at least one cascade of N gain elements operably couplable with analog circuitry, the at least one cascade having at least (a) N greater than or equal to a positive integer sufficient to provide said at least one cascade with a gain such that a predetermined operable signal at an input of said at least one cascade generates a signal at an output of said at least one cascade that is larger than a predetermined operable threshold value, (b) an input of a first gain element of said at least one cascade operably couplable with the analog circuitry, and (c) one or more timing recordation circuits operably coupled with one or more outputs of the N gain elements.

Various other method and/or system aspects are set forth and described in the text (e.g., claims and/or detailed description) and/or drawings of the present application.

The foregoing is a summary and thus contains, by necessity, simplifications, generalizations and omissions of detail; consequently, those skilled in the art will appreciate that the summary is illustrative only and is NOT intended to be in any way limiting. Other aspects, inventive features, and advantages of the devices and/or processes described herein, as defined solely by the claims, will become apparent in the non-limiting detailed description set forth herein.

BRIEF DESCRIPTION OF THE FIGURES

The use of the same symbols in different drawings typically indicates similar or identical items

DETAILED DESCRIPTION OF THE FIGURES

Figure 1:
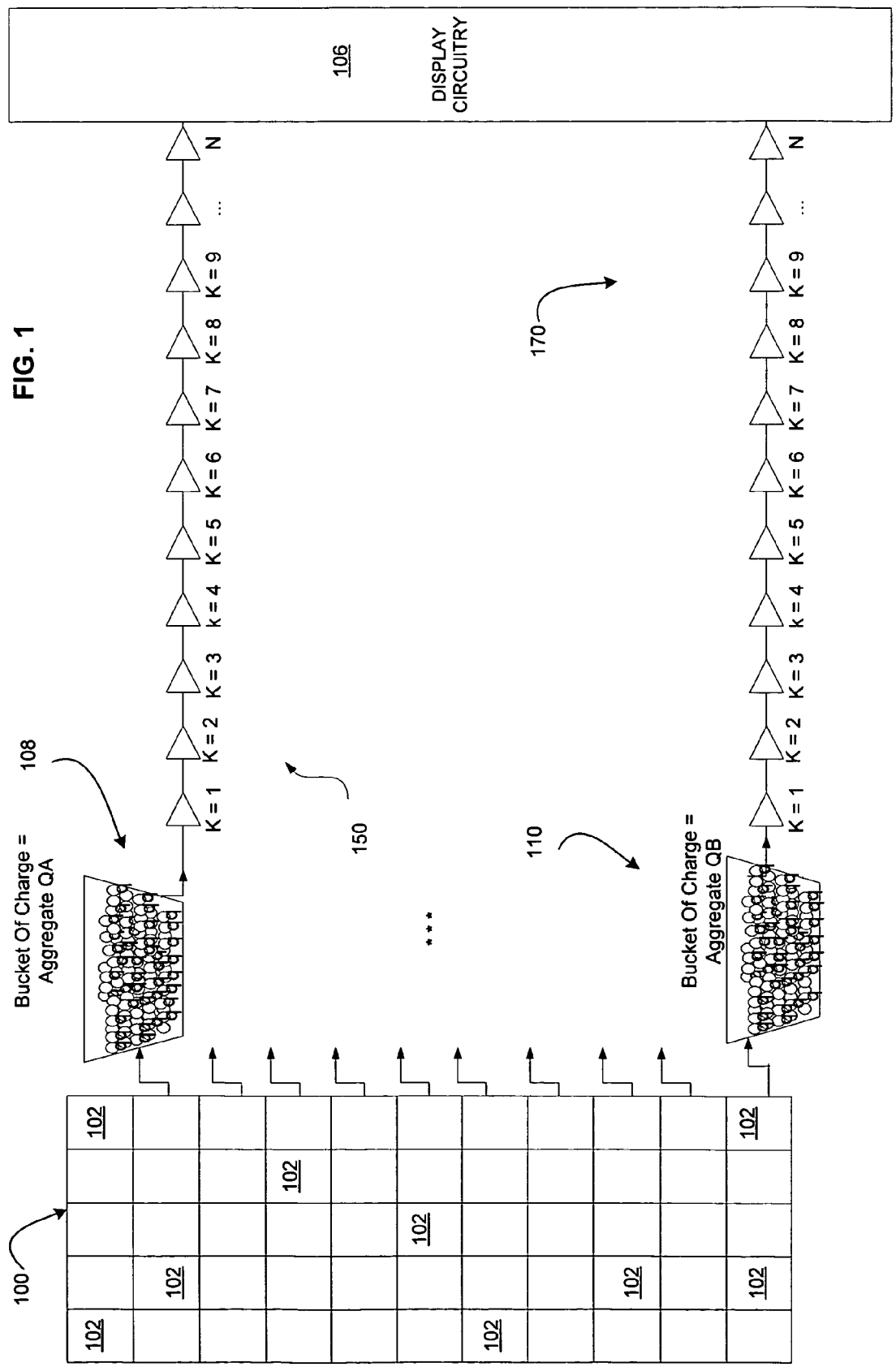
FIG. 1 depicts a system that may form an environment of subject matter described herein.

With reference to the figures, and with reference now to FIG. 1, depicted is a system that may form an environment of subject matter described herein. The system is depicted as including at least one photo-detector array 100. Functions of photo-detector array 100 may include absorption of photons, generation of electric charge corresponding to the photons absorbed, collection of such charge, charge transfer, and/or conversion of the charge to a corresponding voltage. Examples of photo-detector array 100 include but are not limited to charge coupled device (CCD) sensor arrays and complementary metal oxide semiconductor (CMOS) sensor arrays. Those having skill in the art will recognize other examples of photo-detector array 100 in view of the teachings herein.

Photo-detector array 100 is illustrated as having individual photo-detectors 102 arranged in a row and column format. For sake of illustration, photo-detector array 100 is described herein using a shift register format, but those having skill in the art will appreciate that photo-detector array 100 is meant to be inclusive of substantially all suitable photo-detector arrays, including but not limited to Vertical, Linear, Interline, Full-frame, and Frame-transfer arrays.

In photo-detector array 100, each individual photo-detector 102 typically collects charges generated by incident photons over a defined interval (e.g., an exposure time interval). The charges are often generated by incoming photons that excite electrons from a valence band into an electronic conduction band. The number of charges so excited is sometimes directly proportional to the photon-count of the incoming light. At the end of the defined exposure time interval, the charges collected by each individual photo-detector 102 of photo-detector array 100 are shifted out of photo-detector array 100 and into display circuitry 106. As a shorthand notation used for ease of understanding, each photo-detector 102 is described herein as collecting "buckets" of charge Q, where the buckets of charge are representative of received quantity of light. While examples are set forth herein in terms of charge buckets emerging from photo-detector array 100, those having skill in the art will appreciate that the teachings herein may be applied to voltage and/or current-based configurations with a minor amount of experimentation. For example, the teachings herein may be applied to systems that include microphones, temperature detectors, thermocouples, etc. with minor amounts of experimentation.

Photo-detector array 100's rows of individual photo-detectors 102 are shown herein as acting in horizontal shift register fashion. Although each row is coupled with its own respective cascade of N gain elements, only the first and last rows are explicitly illustrated as so coupled for brevity (ellipses in the drawings represent that all rows are so coupled). Specifically, different buckets 108 and 110 of aggregate charges QA and QB—representative of charges collected by individual photo-detectors 102 over the defined exposure time—are illustrated as having been right-shifted out of the top and the bottom rows of photo-detector array 100. Those having skill in the art will appreciate that although photo-detector array 100 is shown as employing a shift-register (e.g., bucket brigade) type architecture, other architectures of photo-detector array 100 are contemplated. For example, some photo-detector arrays employ what are typically referred to as Active Pixel Sensor architectures which apply a readout amplifier to each pixel, allow for charge-to-voltage conversion at each individual pixel. Consequently, in another contemplated implementation each individual photo-detector 102 of photo-detector array 100 is respectively coupled to an individual cascade of N gain elements, and display circuitry 106 is modified accordingly. In other contemplated implementations, amplifying circuitry may be placed elsewhere in a signal chain, providing for multiple gain stages throughout the system. Therefore, photo-detector array 100 is intended to be representative of all the herein described types of photo-detector arrays, as well as other functionally similar ones recognized by those of skill in the art.

Different buckets 108 and 110 of aggregate charge QA and QB are illustrated as having been shifted out of rows of photo-detector array 100, where each bucket 108, 110 represents the aggregate charge "Q" collected by some photo-detector 102 over some period of time (e.g., an exposure time). The fact that each bucket 108 and 110 contains an aggregate charge collected over time is depicted by the lowercase "q"s making up the uppercase "QA" sand "QB" in buckets 108, 110. Buckets 108 and 110 will typically contain different amounts of charge.

Buckets 108 and 110, with aggregate charges QA and QB, are shown as outputs of photo-detector array 100 applied to inputs of the respective cascades 150 and 170 of k=1 to N gain elements. Although cascades 150 and 170 are shown having N gain elements, such is not required. For instance, cascade 150 could have k=1 to J elements, where J is a different number than N.

Focusing now on cascade 170, the number N is preferably chosen to be greater than or equal to a positive integer sufficient to provide cascade 170 with a gain such that a predetermined operable signal at an input of cascade 170 generates a signal at an output of cascade 170 that is larger than a predetermined operable threshold value. For example, if the smallest operable output value of photo-detector array 100 were known, and the smallest operable input signal value of display circuitry 106 were known, then N would preferably be chosen such that the gain of cascade 170 would be at least as large as that necessary to provide display circuitry with its smallest operable input signal value when photo-detector array 100's output is at its smallest detectable value.

In one implementation the gain elements of cascade 170 preferably have a gain larger than one by an amount such that the noise factor of cascade 170 operating on the predetermined signal at the input of said at least one cascade is substantially minimized (e.g., having a noise factor at or near one, such as a noise factor less than 1.1 or 1.2). There are various ways in which the noise factor may be viewed. For instance, the noise factor may be viewed as the ratio of a Signal Power to Thermal Noise ratio at the input of said at least one cascade to an amplified Signal Power to Thermal Noise ratio at the output of the at least one cascade: $(S_{input}/N_{input})/(S_{output}/N_{output})$. Alternatively, the noise factor may be viewed as a ratio of an output noise power of the at least one cascade to the portion thereof attributable to thermal noise in an input termination at standard noise temperature. Alternatively again, the noise factor may be viewed as a ratio of actual output noise to that which would remain if the at least one cascade itself did not introduce noise. In one implementation, the gains of the gain elements in cascade 170 are chosen larger than one by an amount that is practicably small such that the noise contribution to the low noise amplifier from a gain element is substantially minimized. In one implementation, the N gain elements are preferably chosen to be very low gain amplifiers (e.g., gains greater than 1.00 (one) but less than 1.01 (one point zero one) or 1.001 (one point zero zero one) that produce very little additive noise. One example of such extremely low gain amplifiers that produce little additive noise is slightly over-biased amplifiers.

In one implementation, the N gain elements are preferably chosen to include one or more impact ionization-based amplifiers, such as those used in the Texas Instruments IMPACTRON CCDs (available from Texas Instruments Inc., Richardson, Tex., USA) or those used in the Marconi L3Vision CCDs (available from Marconi Applied Technology, United Kingdom). Such amplifiers can use a signal-boosting technique that may effectively reduce CCD read-out noise by a gain factor. Impact-ionization based amplifiers preferably use special high-voltage clocking which can both initiate and then sustain an impact ionization-process. When cascade 170 is implemented with such technologies, bucket 110 of charge can be multiplied such that greatly improved signal-to-noise ratio for signal levels in the vicinity of photo-detector array 100 read-noise floor may be achieved. In another implementation, the N gain elements are preferably chosen to include one or more low noise operational amplifiers. In yet other implementations, one or more of the N gain elements include other suitable low noise amplifiers chosen in accordance with the teachings herein.

Figure 2:
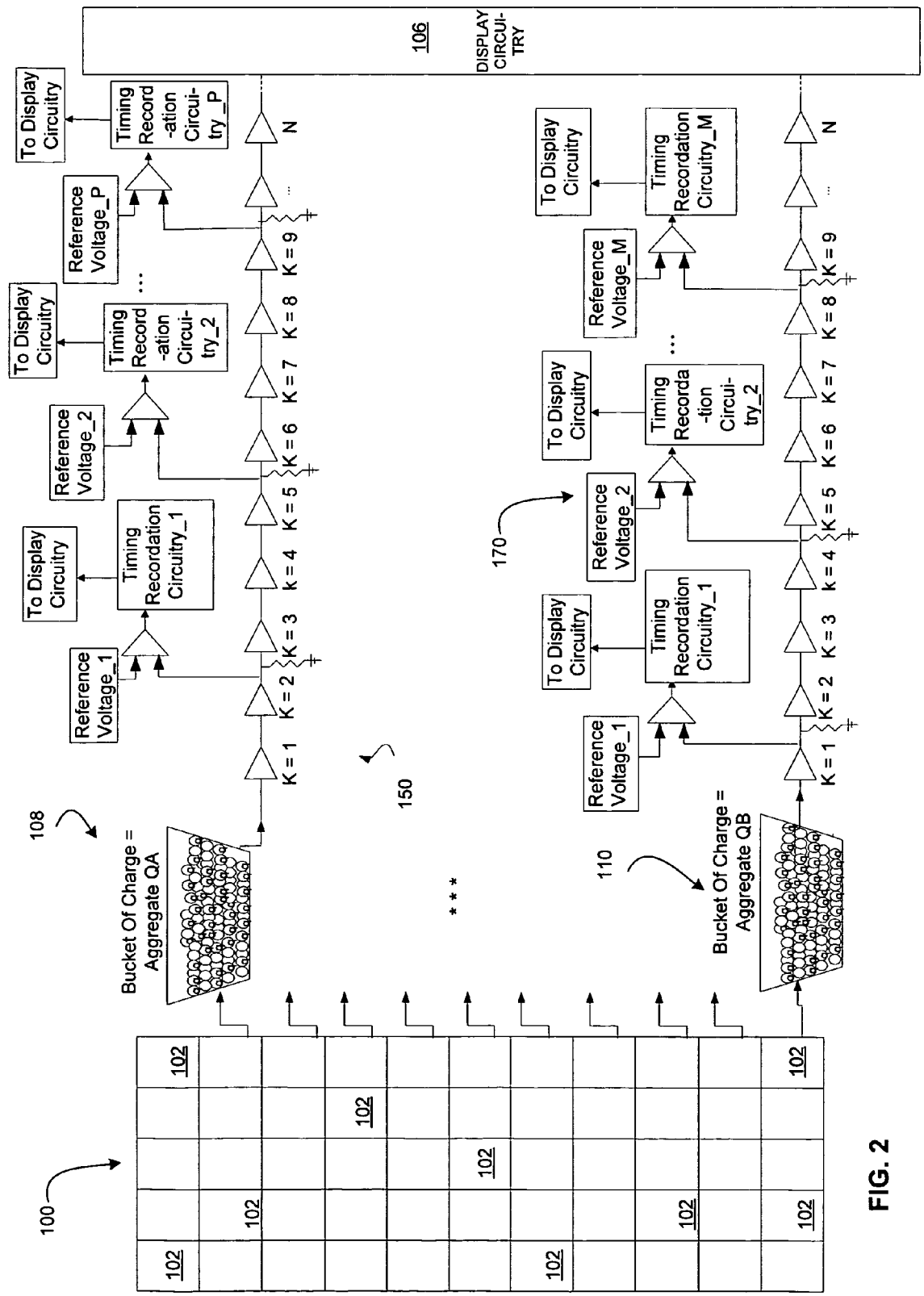
FIG. 2 shows the structure of FIG. 1 modified to provide an intensity detector.

With reference now to FIG. 2, shown is the structure of FIG. 1, modified to provide an intensity detector. While the present description refers to "intensity" and "intensity detectors," those having skill in the art will appreciate that in some contexts brightness is used as measure of relative intensity value(s), for example, after an image of an object has been processed (e.g., by an analog-to-digital (A/D) converter). That is, in some contexts intensity is a measure of the magnitude or quantity of light energy reflected or transmitted through an imaged object, while brightness is a relative measure among intensities (e.g., processed intensities). Accordingly, while the present description refers to "intensity" and "intensity detectors," those skilled in the art will appreciate that, as used herein, such terms can also be indicative of brightness, brightness detectors, and/or other light properties and light property detectors, depending upon contexts. Cascade 150 fed by bucket 108 of aggregate charge QA is shown having P attached voltage comparators. The inputs of gain elements having the attached comparators are also shown as having resistors connected to ground. These resistors are preferably large so as to draw as little current as is practicable. Each comparator is illustrated as having its own respective reference voltage depicted as reference voltage_1 through reference voltage_P. The respective comparators will trigger when the voltages across their respective resistors exceeds their respective reference voltages. In another embodiment (not shown) current comparators are used to directly sense the current.

Each comparator 1-P is depicted as having a respective output to timing recordation circuit_1 through timing recordation circuit_P. In one exemplary implementation, each timing recordation circuit_1 through timing recordation circuit_P records a time at which its respectively coupled comparator 1-P triggers. For example, the timing recordation circuits would record times at or around those times at which the respective gain element outputs exceeded reference voltage_1 through reference voltage_P.

Each timing recordation circuit 1-P is depicted as having an output to display circuitry 106. Display circuitry 106 is shown as using the recorded times of the timing recordation circuits 1-P to augment the amplified value received from cascade 150 of gain elements. In one implementation, the timing recordation circuits 1-P are such that display circuitry 106 may use the output times to provide a direct intensity quantization and/or digital conversion of intensity; these alternate implementations are depicted in FIG. 2 by the dashed line connecting the Nth gain element with display circuitry 106, and are also shown and described further herein.

Cascade 170 fed by bucket 110 of aggregate charge QB is shown having M attached comparators. The inputs of gain elements having the attached comparators are also shown as having resistors connected to ground. These resistors are preferably large so as to draw as little current as is practicable. Each comparator is illustrated as having its own respective reference voltage depicted as reference voltage_1 through reference voltage_M. The respective comparators will trigger when the voltages across their respective resistors exceed their respective reference voltages. In another embodiment (not shown) current comparators are used to directly sense the current.

Each comparator 1-M is depicted as having a respective output to timing recordation circuit_1 through timing recordation circuit_M. In one exemplary implementation, each timing recordation circuit_1 through timing recordation circuit_M records a time at which its respectively coupled comparator 1-M triggers. For example, the timing recordation circuits would record times at or around those times at which the respective gain element outputs exceeded reference voltage_1 through reference voltage_M.

Each timing recordation circuit 1-M is depicted as having an output to display circuitry 106. Display circuitry 106 is shown as using the recorded times of the timing recordation circuits 1-M to augment the amplified value received from cascade 170 of gain elements. In one implementation, the timing recordation circuits 1-M are such that display circuitry 106 may use the output times to provide a direct intensity quantization and/or digital conversion of intensity; these alternate implementations are depicted in FIG. 2 by the dashed line connecting the Nth gain element with display circuitry 106, and are also shown and described further herein.

Continuing to refer to FIG. 2, and concentrating on cascade 170 fed by bucket 110, the inventors have discovered that a relationship exists between the outputs of each of the cascaded N gain elements and the charge "pressure" at the input of an initial gain element of the cascade. Specifically, the inventors have discovered that lower relative amounts of aggregate charge (e.g., aggregate charge QB of bucket 110) to slower output rise times for gain elements in cascade 170, while greater relative amounts of charge QB translate to faster output rise times for gain elements in cascade 160. As has been described, comparators 1_M are coupled to monitor output voltages for certain gain elements of cascade 170 of N gain elements Accordingly, the inventors have discovered that empirical relationships can be recorded between known amounts of charge QB of bucket 110 and times at which the outputs of the various gain elements satisfy the threshold voltage values of their respectively coupled comparators (e.g., reference voltages 1-M). In some exemplary implementations, these empirical relationships between times at which thresholds are satisfied and known aggregate charge QB are recorded in look-up tables which are thereafter utilized to infer an aggregate charge, and hence intensity, from detected times at which comparators thresholds are satisfied.

In some exemplary implementations, look-up tables described herein are generated by the following process. A "test" or "calibration" cascade having operably coupled comparators and timing recordation circuits consonant with the teachings herein, is first constructed. Subsequent to construction, the test or calibration cascade is subjected to a first known amount of charge QB and the transition times of the respective comparators are recorded in association with that first known amount of charge. Thereafter, the test or calibration cascade is subjected to second, third, fourth, fifth, sixth, etc. known amounts of charge QB and the transition times of the respective comparators are likewise recorded in association with those second, third, fourth, fifth, sixth, etc. known amounts in order to create the look-up table.

With one or more look-up tables so constructed, the inventors have discovered that they can use measured transition times of other cascades—constructed to respond substantially analogously to the "test" or "calibration" cascade used to create the look-up tables—to infer an amount of input charge QB that gave rise to the measured transition times.

Figure 3:
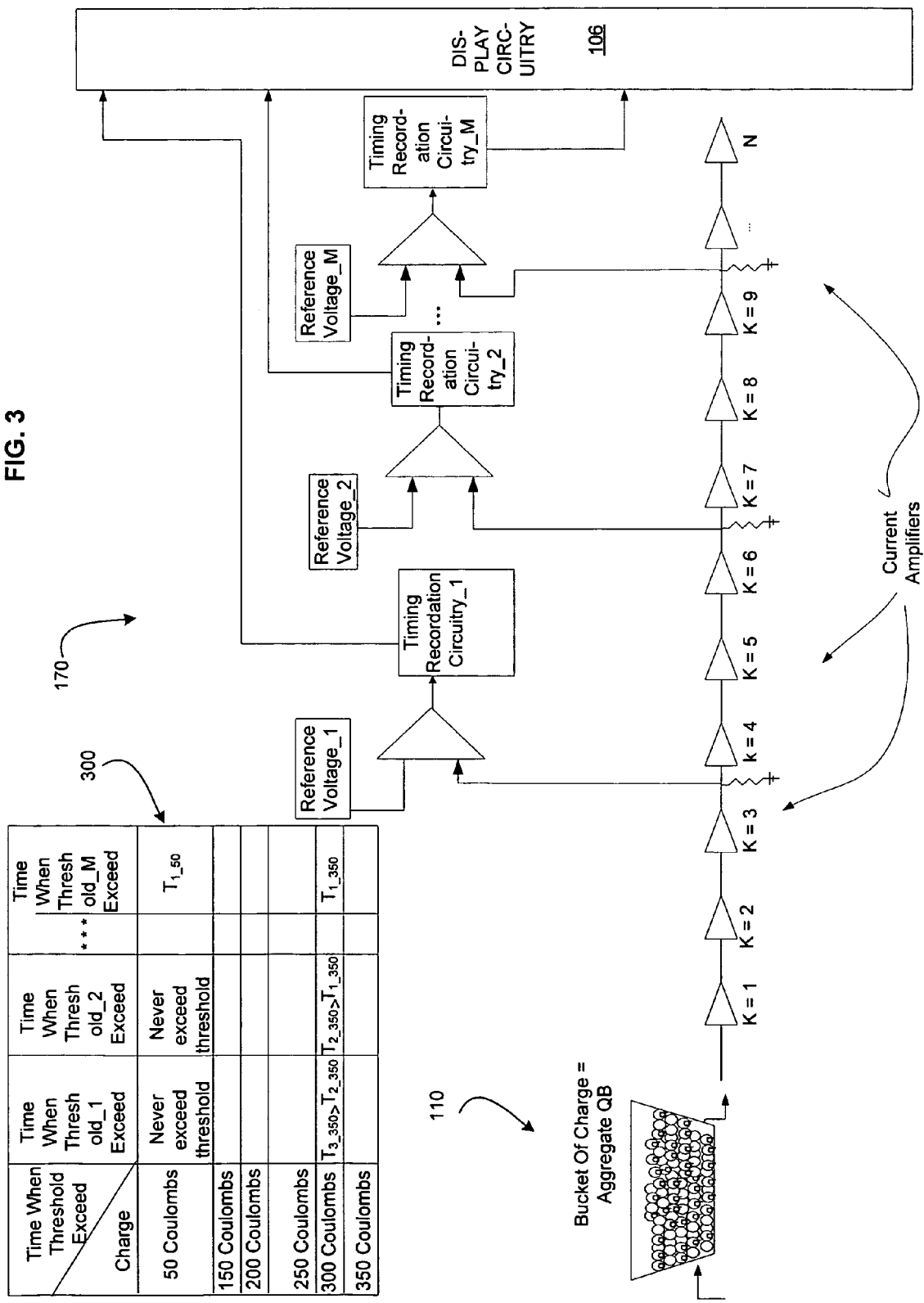
FIG. 3 illustrates a break out view of an alternate implementation of lower cascade 170 fed by bucket 110 (see FIG. 2) in conjunction with look-up table 300 that may form an environment for processes.

Referring now to FIG. 3, illustrated is a break out view of an alternate implementation of lower cascade 170 fed by bucket 110 (see FIG. 2) in conjunction with look-up table 300 that may form an environment for processes. Cascade 170 is constructed such that it responds substantially analogously to the test or calibration cascade that was used to devise look-up table 300. In some example implementations, look up table 300 will have been previously generated by the empirical process described elsewhere herein.)

Look-up table 300 is depicted as having example entries of input charge (shown in coulomb units, but those having skill in the art will appreciate that other charge measures may be utilized, such as a number of electron charges).

In one exemplary implementation of a process, an intensity measure may be determined as follows. Subsequent to photodetector array 100 clocking bucket 110 of charge QB to cascade 170, timing recordation circuits 1-M record if and/or when their respectively connected comparators 1-M trigger. Thereafter, at the end of some pre-defined interval (e.g., an interval at least as long in duration as an average settling time of cascade 170), display circuitry 106 collects the outputs of timing recordation circuits 1-M. Typical outputs of timing recordation circuits 1-M would generally be indications of if/when their respective comparators 1-M transitioned during the pre-defined interval.

Display circuitry 106 would thereafter typically compare the outputs of timing recordation circuits 1-M against the times of look-up table 300 using conventional numerical processing techniques to determine which of the listed times of look-up table 300 best fit the data. In one implementation, display circuitry 106 then would assess as the likely input charge that charge associated with the times that best fit the recorded data of timing recordation circuits 1-M using any one or more of conventional interpolation and/or curve fitting techniques and/or combinations thereof (e.g., such as those described in C. Gerald and O. Wheatley, Applied Numerical Analysis ($5^{th}$ edition 1994).

Although not expressly shown, it is to be understood that in some exemplary implementations various cascades present would have look-up tables associated with them. For example, referring again to FIG. 2, cascade 150 would have its own associated look-up table analogous to look up table 300 shown and described herein in relation to cascade 170.

Figure 4:
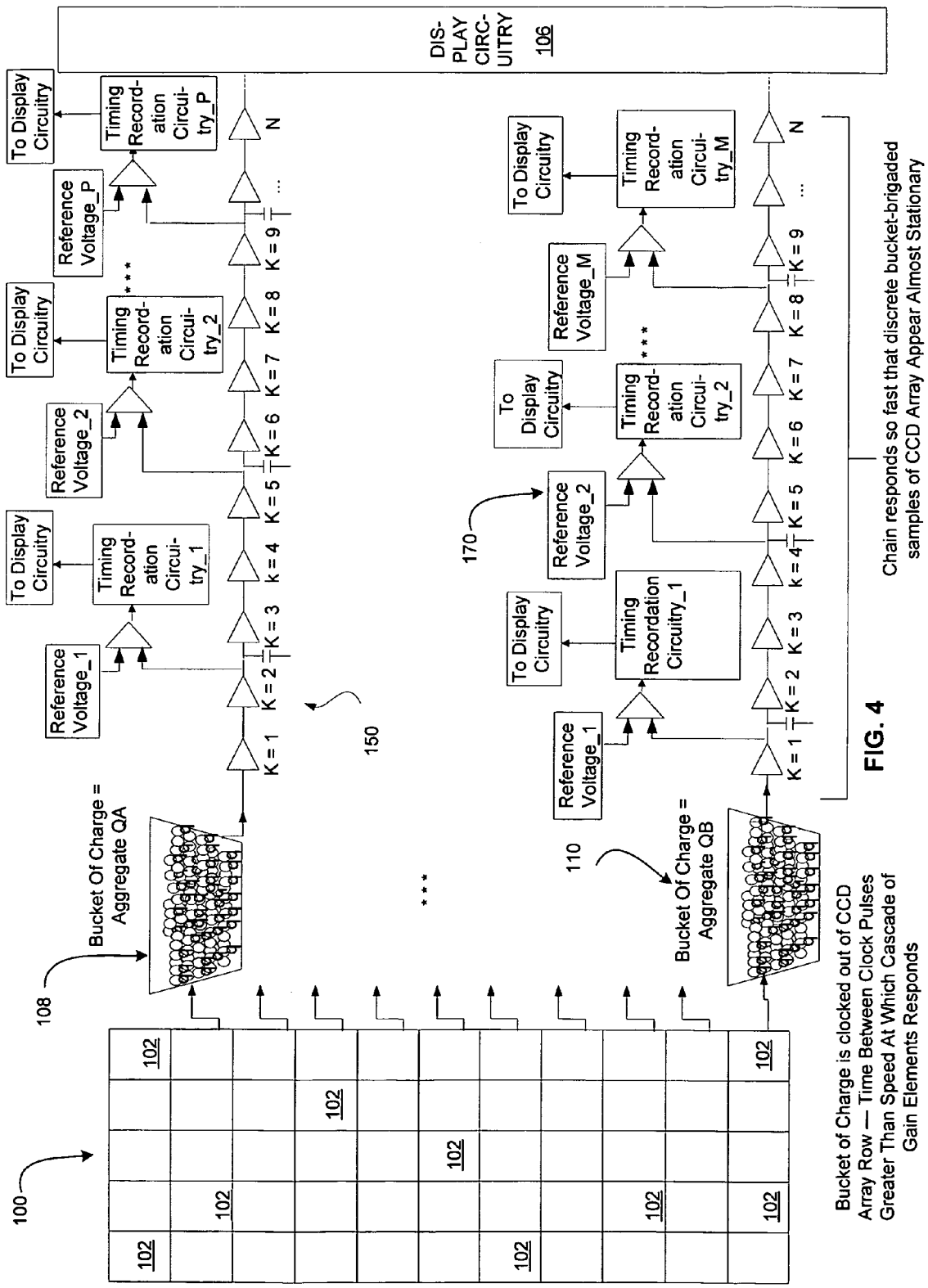
FIG. 4 shows an alternative embodiment of the structures of FIG. 2 wherein the resistors have been replaced by capacitances.

With reference now to FIG. 4, shown is an alternative embodiment of the structures of FIG. 2 wherein the resistors have been replaced by capacitances. One implementation in which the structures of FIG. 4 prove useful is that wherein the time interval between successive buckets of charge clocked into cascade 150 of N gain elements is greater than the time needed for cascade 170 to effectively settle. That is, in a circuit where cascade 170 responds so fast that cascade 170 will have effectively completed its response to bucket 110 of charge QB long before a next bucket of charge is shifted onto the input of cascade 170. As cascade 170 settles in response to bucket 100 of charge QB, the capacitors associated with the respective comparators 1-M will gather charge and present voltage which can be monitored in a fashion analogous to that described above in relation to FIG. 2. The remaining components of FIG. 4 function analogous to like components described elsewhere herein.

Figure 5:
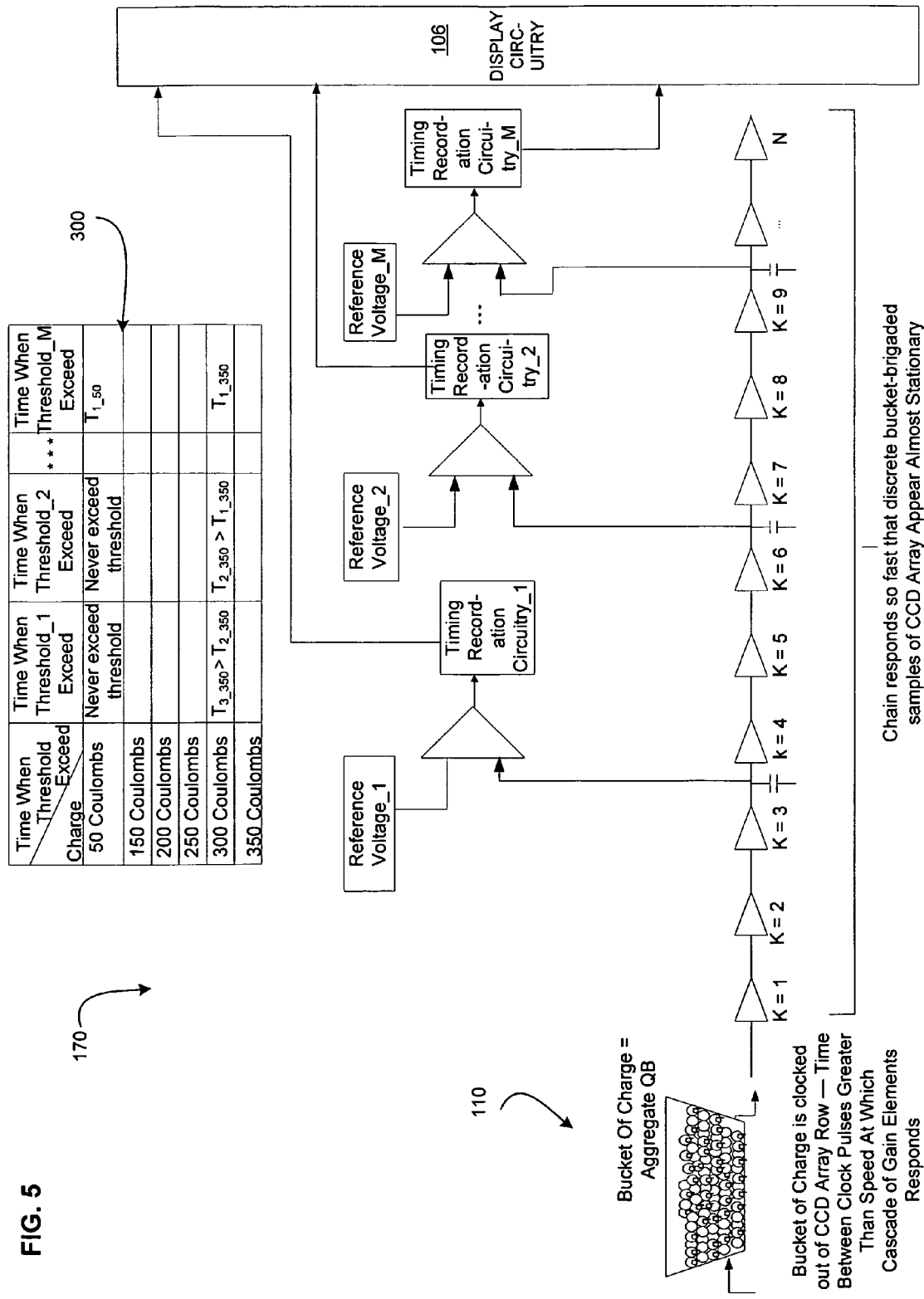
FIG. 5 shows an alternative embodiment of the structures of FIG. 3 wherein the resistors have been replaced by capacitances.

With reference now to FIG. 5, shown is an alternative embodiment of the structures of FIG. 3 wherein the resistors have been replaced by capacitances. The structures of FIG. 5 prove particularly useful in instances similar to those described in relation to FIG. 4. The components of FIG. 4 function analogous to like components described elsewhere herein.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will require optically-oriented hardware, software, and or firmware. In addition to the foregoing, those skilled in the art will appreciate that components and component settings will take into account standard design concerns, such as preventing undesired saturation of amplifiers.

The foregoing detailed description has set forth various embodiments of the devices and/or processes via the use of block diagrams, flowcharts, and examples. Insofar as such block diagrams, flowcharts, and examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. In one embodiment, the present invention may be implemented via Application Specific Integrated Circuits (ASICs), Field Programmable Gate Arrays (FPGAs), or other integrated formats. However, those skilled in the art will recognize that the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the present invention are capable of being distributed as a program product in a variety of forms, and that an illustrative embodiment of the present invention applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various embodiments described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), electrical circuitry forming a communications device (e.g., a modem, communications switch, or optical-electrical equipment), and any non-electrical analog thereto, such as optical or other analogs.

Those skilled in the art will recognize that it is common within the art to describe devices and/or processes in the fashion set forth herein, and thereafter use standard engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, computational entities such as operating systems, drivers, and applications programs, and one or more interaction devices, such as a keyboard, a mouse, or audio component. A typical data processing system may be implemented utilizing any suitable commercially available computer system.

Those skilled in the art will recognize that it is common within the art to describe devices and/or processes in the fashion set forth herein, and thereafter use standard engineering practices to integrate such described devices and/or processes into communications systems. That is, at least a portion of the devices and/or processes described herein can be integrated into a communications system via a reasonable amount of experimentation. Those having skill in the art will recognize that a typical communications system generally includes one or more of a network operating system, a network interface card, a communications medium (e.g., electronic, optical, wireless, etc.), a data bus, and devices to couple communications media (e.g., switches, bridges, routers, repeaters, etc). A typical communications system may be implemented utilizing any suitable commercially available network components (e.g., local area network components, wide area network components, optical network components, wireless network components, virtual private network components, etc.).

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

While particular embodiments of the present invention have been shown and described, it will be understood by those skilled in the alt that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," "comprise" and variations thereof, such as, "comprises" and "comprising" are to be construed in an open, inclusive sense, that is as "including, but not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

What is claimed is:

1. A system of determining an intensity measure, said system comprising:
    circuitry for receiving an input signal at an input of a first gain element of a cascade of N gain elements, wherein said cascade of N gain elements includes at least one gain element constructed to generate a gain based on an impact ionization process; and
    circuitry for assessing an intensity in response to one or more times associated with one or more output signals of the cascade of N gain elements satisfying one or more threshold values.

2. The system of claim 1, wherein at least one gain element has a gain larger than one but less than 1.001.

3. The system of claim 1, wherein at least one gain element has a gain larger than one but less than 1.01.

4. The system of claim 1, wherein at least one gain element has a gain that is provided by over biasing the at least one gain element.

5. The system of claim 1, wherein at least one gain element comprises a solid state electron multiplying amplifier.

6. The system of claim 1, wherein said circuitry for assessing an intensity in response to one or more times associated with one or more output signals of the cascade of N gain elements satisfying one or more threshold values further comprises:
    circuitry for detecting a first time associated with a first output signal of the cascade of N gain elements satisfying a first threshold value;
    circuitry for detecting a second time associated with a second output signal of the cascade of N gain elements satisfying a second threshold value; and
    circuitry for assessing the intensity in response to at least one of the first time or the second time.

7. The system of claim 6, wherein said circuitry for detecting a first time associated with a first output signal of the cascade of N gain elements satisfying a first threshold value further comprises:
    circuitry for detecting when a comparator operably coupled with a first output of the cascade of N gain elements triggers.

8. The system of claim 6, wherein said circuitry for detecting a second time associated with a second output signal of the cascade of N gain elements satisfying a second threshold value further comprises:
    circuitry for detecting when a comparator operably coupled with a second output of the cascade of N gain elements triggers.

9. The system of claim 6, wherein said circuitry for assessing the intensity in response to at least one of the first time or the second time further comprises:
    circuitry for consulting a look-up table having one or more threshold trigger times associated with at least one of the first output or the second output of the cascade of N gain elements.

10. A method of determining an intensity measure, said method comprising:
    receiving an input signal at an input of a first gain element of a cascade of N gain elements, wherein said cascade of N gain elements includes at least one gain element constructed to generate a gain based on an impact ionization process; and
    assessing an intensity in response to one or more times associated with one or more output signals of the cascade of N gain elements satisfying one or more threshold values.

11. A system of determining an intensity measure, said system comprising:
    means for receiving an input signal at an input of a first gain element of a cascade of N gain elements, wherein said cascade of N gain elements includes at least one gain element constructed to generate a gain based on an impact ionization process; and
    means for assessing an intensity in response to one or more times associated with one or more output signals of the cascade of N gain elements satisfying one or more threshold values.

12. The system of claim 1, wherein said circuitry for assessing an intensity in response to one or more times associated with one or more output signals of the cascade of N gain elements satisfying one or more threshold values further comprises:
    circuitry for assessing an intensity in response to two or more respective times associated with two or more respective output signals of the cascade of N gain elements satisfying two or more respective threshold values; and
    circuitry for consulting a look-up table having two or more respective threshold trigger times associated with the two or more respective output signals of the cascade of N gain elements.

* * * * *